(12) United States Patent
Higdon et al.

(10) Patent No.: US 6,375,062 B1
(45) Date of Patent: *Apr. 23, 2002

(54) SURFACE BUMPING METHOD AND STRUCTURE FORMED THEREBY

(75) Inventors: William D. Higdon, Greentown; Frank Stepniak, Noblesville, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/706,543

(22) Filed: Nov. 6, 2000

(51) Int. Cl.[7] ............................................... B23K 31/02
(52) U.S. Cl. .................................. 228/214; 228/180.22
(58) Field of Search .................................. 428/209, 212, 428/213; 257/772; 438/653, 654, 656; 228/214, 180.22

(56) References Cited

U.S. PATENT DOCUMENTS

| | | | |
|---|---|---|---|
| 4,840,302 A | * | 6/1989 | Gardner et al. |
| 5,508,229 A | * | 4/1996 | Baker |
| 5,547,740 A | * | 8/1996 | Higdon et al. |
| 5,888,892 A | * | 3/1999 | Yanagida et al. |
| 6,196,443 B1 | * | 3/2001 | DiGiacomo |
| 6,251,501 B1 | * | 6/2001 | Higdon et al. |
| 6,258,705 B1 | * | 7/2001 | Chien et al. |
| 6,281,106 B1 | * | 8/2001 | Higdon et al. |

* cited by examiner

*Primary Examiner*—Tom Dunn
*Assistant Examiner*—Jonathan Johnson
(74) *Attorney, Agent, or Firm*—Jimmy L. Funke

(57) ABSTRACT

A solder bumping method and structure for fine solder bump pitches. The method makes use of a semiconductor device having an input/output pad whose surface is provided with a solderable metal layer that serves as the UBM of the solder bump. A sacrificial layer is formed on the surface of the device to surround the metal layer. A plating seed layer is then formed on the metal layer and the surrounding surface of the sacrificial layer, after which a mask is formed on the seed layer and a via is defined in the mask to expose portions of the seed layer overlying the metal layer and the sacrificial layer. A solder material is deposited on the seed layer exposed within the via. The mask is then removed, followed by removal of a portion of the seed layer that is not covered by the solder material, leaving intact that portion of the seed layer beneath the solder material. The sacrificial layer is then removed, including that portion of the sacrificial layer underlying the seed layer, such that a gap is formed between the substrate and the remaining seed layer. Finally, the solder material is reflowed to form a solder bump into which the remaining seed layer is dissolved.

11 Claims, 1 Drawing Sheet

SURFACE BUMPING METHOD AND STRUCTURE FORMED THEREBY

TECHNICAL FIELD

The present invention generally relates to solder bumping methods and structures. More particularly, this invention relates to a solder bumping method for a surface-mount (SM) device, which includes plating a solder material on a plating seed layer covering an under bump metallurgy (UBM), wherein the seed layer covers a much larger area than the UBM to increase the amount of solder material available to subsequently coalesce during reflow to form the solder bump on the UBM.

BACKGROUND OF THE INVENTION

Surface-mount (SM) semiconductor devices such as flip chips typically include an integrated circuit and bead-like terminals formed on one of their surfaces. The terminals are typically in the form of solder bumps near the edges of the chip, and serve to both secure the chip to a circuit board and electrically interconnect the flip chip circuitry to a conductor pattern on the circuit board. The circuit board may be a ceramic substrate, printed wiring board, flexible circuit or silicon substrate, though other substrates are possible. Due to the numerous functions typically performed by the microcircuitry of a semiconductor device, a relatively large number of solder bumps are required. The size of a typical flip chip is generally on the order of a few millimeters per side, resulting in the solder bumps being crowded along the edges of the chip.

Because of the narrow spacing required for the solder bumps and their conductors, soldering a flip chip or other SM semiconductor device to a conductor pattern requires a significant degree of precision. Reflow solder techniques are widely employed for this purpose, and entail precisely depositing a controlled quantity of solder on the bond pads of the chip using methods such as electrodeposition and printing. Once deposited, heating the solder above its liquidus temperature serves to form the characteristic spherical-shaped solder bumps on the pads. After cooling to solidify the solder bumps, the chip is soldered to the conductor pattern by registering the solder bumps with their respective conductors and then reheating, or reflowing, the solder so as to form solder bump connections that metallurgically adhere to the conductors.

Flip chip input/output pads are electrically interconnected with the circuitry on the flip chip through vias. Because aluminum metallization is typically used in the fabrication of integrated circuits, input/output pads are typically aluminum or aluminum alloy, which are generally unsolderable and susceptible to corrosion if left exposed. In applications where copper metallization is used, copper pads are susceptible to being dissolved into the solder connections during reflow. Consequently, bond pads are often formed to include the input/output pad and one or more additional metal layers that promote wetting and metallurgical bonding with solder bump alloys. These additional metal layers, or under bump metallurgy (UBM), may be, for example, electroless nickel and a top layer of gold that will readily wet and bond with typical tin-lead solder alloys. Another suitable UBM composition has a multilayer structure that includes an adhesion-promoting layer, a diffusion barrier layer, and a solderable layer. The adhesion layer may be aluminum or another metal composition that will bond to the underlying aluminum input/output pad. Copper is readily solderable, i.e., can be wetted by and will metallurgically bond with solder alloys of the type used for solder bumps. Therefore, a thin layer of copper is a common choice for the top layer of the UBM. The diffusion barrier layer is typically a nickel-vanadium or chromium-copper alloy, and is disposed between the adhesion and solderable layers to inhibit diffusion between the solder and aluminum pad. A NiV and CrCu layer also serves as a wettable layer if an overlaying copper layer is dissolved into the solder.

Placement of the chip and reflow of the solder must be precisely controlled not only to coincide with the spacing of the bond pads and the conductors to which the solder bumps are registered and reflow soldered, but also to control the height of the solder bump connections after reflow. As is well known in the art, controlling the height of solder bump connections after reflow is often necessary to prevent the surface tension of the molten solder from drawing the flip chip excessively close to the substrate during the reflow operation. Sufficient spacing between the chip and its substrate, often termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

Control of solder bump position, height and pitch are dictated in part by the manner in which the solder is deposited on the bond pads. One known technique is to use a photoimagable dry film as a stencil for printing a solder paste on the bond pads of a flip chip. The location and size of the solder bumps are determined by the vias in the dry film, which contain the solder during reflow. With relatively large bump spacings and conventional solders, this process is reliable and cost effective. However, for relatively fine pitches (e.g., a pitch of 200 micrometers or less), vias can be difficult to form in a dry film, and it is difficult to get a uniform distribution of solder paste into a small via. Finally, solder compositions that can be used with this method are limited to those with reflow temperatures at or below the maximum temperature the dry film material can withstand and still be removed after reflow.

Finer solder bump pitches can generally be obtained with plating methods. One such technique involves depositing metal films on the semiconductor wafer, forming a plating mask, electroplating a minibump of a solderable material, electroplating a layer of solder, and then removing the mask and the exposed metal films. The minibump and that portion of the metal film remaining beneath the solder serve as a UBM. A disadvantage to this approach is that chemistries used to remove the metal film between solder bumps must be compatible with and not degrade the bumps. Another disadvantage with solder plating is that the volume of solder that can be plated for individual bumps is limited. One technique to overcome this limitation is to pattern the plating resist with vias the size of the UBM, and then allow the solder to plate over the top of the resist and take on a mushroom-like shape. During the plating process, the solder above the resist plates laterally almost as fast as the solder plates vertically over the via. When the bumps are very closely spaced, the lateral growth of the mushroom shape must be limited to prevent neighboring bumps from growing together. An alternative technique used for fine pitch bumps is to use a very thick plating resist, resulting in a slow and expensive plating process. The control of solder volume is better when the plated metal is kept below the upper surface of the resist (i.e., entirely within the via) and the side walls of the bumps are defined by the resist rather than allowing the volume to depend on surface irregularities that inherently occur when the solder is plated to have a mushroom shape.

From the above it can be seen that, while fine solder bump pitches can be attained by plating techniques, process and material compatibilities between UBM formation, solder bump formation and reliability are limitations. Accordingly, it would be desirable if an improved method were available for forming fine-pitch solder bumps on flip chips and other SM semiconductor devices that employ solder bumps.

SUMMARY OF THE INVENTION

According to this invention, a solder bumping method and structure are provided that achieve fine solder bump pitches and eliminates conventional process compatibility requirements for UBM and solder bump formation. The method generally makes use of a semiconductor device having an input/output pad whose surface is provided with a solderable metal layer that serves as the UBM of the solder bump. A sacrificial layer is formed on the surface of the device to surround the metal layer. A plating seed layer is then formed on the metal layer and the surrounding surface of the sacrificial layer, after which a mask is formed on the seed layer and a via is defined in the mask to expose portions of the seed layer overlying the metal layer and the sacrificial layer. A solder material is then deposited on the seed layer exposed within the via.

Once the above structure is completed, the mask can be removed, followed by removal of a portion of the seed layer that is not covered by the solder material, leaving intact that portion of the seed layer beneath the solder material. The sacrificial layer is then removed, including that portion of the sacrificial layer underlying the seed layer, such that a gap is formed between the substrate and the remaining seed layer. Finally, the solder material is reflowed to form a solder bump into which the remaining seed layer is dissolved.

Because the via formed in the mask is not limited by the size of the metal layer, a considerably greater amount of solder material can be deposited than otherwise permitted if limited to the surface area of the metal layer. As a result, larger solder bumps that provide greater chip stand-off height are made possible with this invention. An additional advantage of the invention is that the via is not limited to the shape of the metal layer. In other words, while the metal layer may have a conventional circular shape, the via may have an oblong shape to further increase the amount of solder material available to form the solder bump. To achieve this latter advantage of the invention, the sacrificial layer serves an important role by preventing the seed layer and solder material from contacting portions of the device surface that are so remote from the metal layer as to lie outside of the perimeter of the resulting solder bump. The concern here is that the seed layer and solder material tend to leave metallic-based fragments on the surface of the device following solder bump reflow, and that these fragments might be detrimental to device performance. By separating the seed layer and solder material from the surface of the device that will be outside the perimeter of the solder bump, the likelihood is eliminated for the seed layer and solder material to leave metallic-based fragments following solder bump reflow that might cause electrical problems for the device.

From the above, it can be seen that the solder bump structure and process of this invention also enable the use of a solderable metal layer (UBM) that can be specifically formulated to promote the reliability of the resulting solder connection formed by the solder bump, without concern for process compatibility with the solder bump. Due to the presence of the plating seed layer, the solderable metal layer does not dictate the manner in which the solder material is deposited or the amount of solder material deposited, and therefore does not dictate the size of the solder bump formed by the solder material. Instead, the plating seed layer enables the mask thickness and via size and shape to determine the amount of solder material that can be deposited. Finally, the sacrificial layer further promotes the size of the via that can be formed, and therefore the amount of solder material available for the solder bump, without leaving potentially detrimental metallic residues of the seed layer and solder between solder bumps.

Other objects and advantages of this invention will be better appreciated from the following detailed description.

DESCRIPTION OF THE PREFERRED EMBODIMENT

Figure 1:
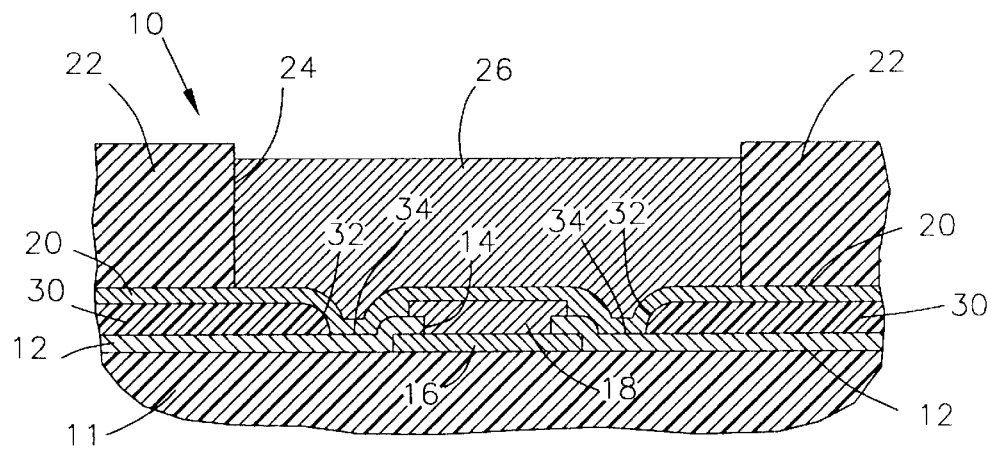
FIGS. 1 through 4 represent processing steps for forming solder bumps in accordance with the present invention.
Figure 2:
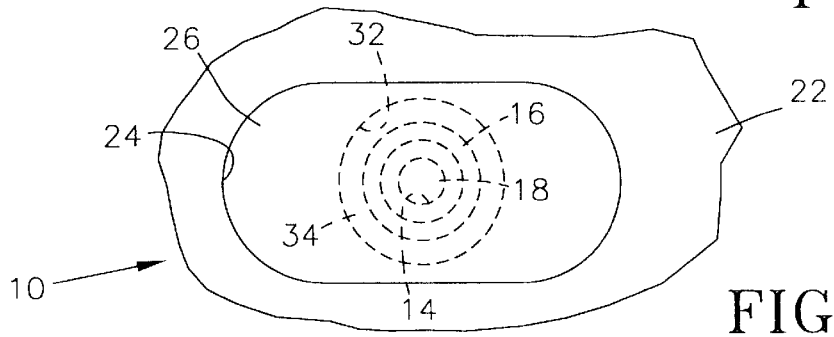
Figure 3:
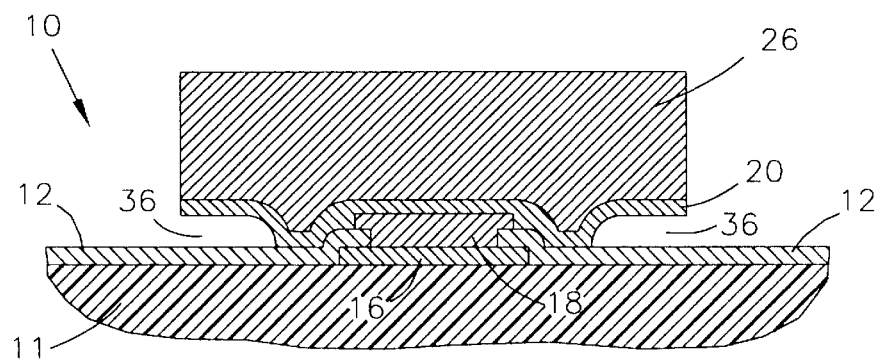
Figure 4:
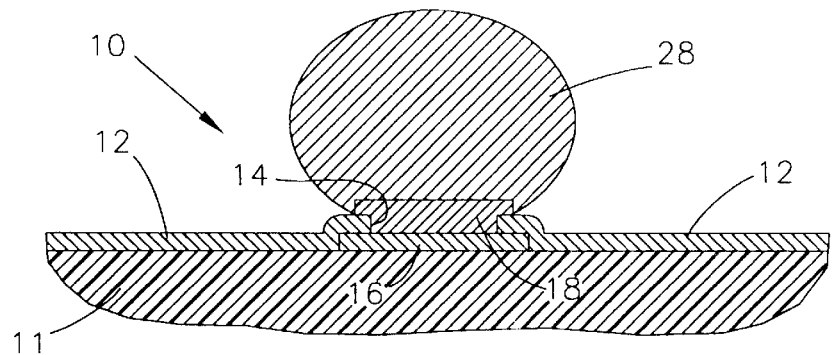

FIGS. 1, 3 and 4 represent partial cross-sectional views and FIG. 2 represents a plan view of a flip chip 10 or other surface-mount semiconductor circuit device at different process levels of the present invention. As illustrated, the chip 10 includes a passivation layer 12 that is conventionally present to protect the underlying substrate 11 of the chip 10 from environmental contaminants, moisture and electrical shorts. The passivation layer 12 is typically silicon dioxide, though silicon nitride, polyimides, phosphosilicated glass (PSG), borophosphosilicated glass (BPSG), and Dow Chemical's CYCLOTENE may also be used. Exposed by an opening 14 in the passivation layer 12 is a portion of an input/output pad 16. The pad 16 can be conventionally formed of aluminum or an aluminum-base alloy, and is therefore generally unsolderable and susceptible to corrosion if left exposed. Alternatively, the pad 16 can be formed of copper or a copper alloy.

Covering the pad 16 is a UBM 18 that provides a solderable surface for a mass of solder 26. The UBM 18 can be a combination of thin films or a short bump either electroplated or formed of electroless nickel in accordance with prior art practices. In a preferred embodiment, the UBM 18 is formed to include an adhesion layer, a diffusion barrier layer, and a solderable layer. Suitable adhesion layer materials include aluminum, titanium, chromium and tungsten, which directly contact and metallurgically bond to the input/output pad 16. Suitable solderable layer materials include copper and gold, while suitable materials for the diffusion barrier layer include nickel-vanadium, chromium-copper and palladium. The diffusion barrier layer is between the adhesion and solderable layers to reduce solid state diffusion between the UBM 18 and a solder bump 28 (FIG. 4) formed from the solder 26. Particularly suitable combinations for the adhesion, diffusion barrier and solderable layers of the UBM 18 are, respectively: aluminum, nickel-vanadium and copper; titanium, nickel-vanadium and copper; chromium, chromium-copper, copper and gold; titanium, palladium and gold; and titanium-tungsten, nickel-vanadium and copper. A suitable thickness for the UBM 18 is about one to about two micrometers, though greater and lesser thicknesses are possible. A minibump (not shown) could also be formed as part of the UBM 18, with the resulting UBM having a thickness of about ten to fifteen micrometers.

The UBM 18 is patterned to define the area that serves as the solderable contact of the chip 10. The process used to pattern the UBM 18 is completed prior to the deposition of the solder 26 and formation of the solder bump 28. According to this invention, an additional layer of metal is deposited on the chip 10 so as to be between the UBM 18 and solder 26, as shown in FIG. 1. For reasons to become apparent below, this metal layer, termed herein the plating seed layer 20, covers the UBM 18 and a portion of the surface of the chip 10 surrounding the UBM 18, as seen in FIGS. 1 and 2. As a matter of processing convenience, the seed layer 20 is preferably deposited by a vacuum deposition process such as sputtering or evaporation to cover the entire surface of the chip 10. Suitable materials for the seed layer 20 include copper, silver and any other materials that can be easily plated and dissolved with the solder alloy desired for the solder bump 28. As will be explained below, preferred materials for the seed layer 20 are soluble in the solder alloy.

A plating mask 22 is then applied to the chip 10, and a via 24 is defined in the mask 22 to expose a portion of the seed layer 20 over the UBM 18. The mask 22 is preferably formed of a photoimagable material that meets the feature definition and thickness requirements for the solder plating process, such that a desired amount of solder 26 can be appropriately deposited on the seed layer 20 above the UBM 18. A suitable photoimagable material for this purpose is a positive photoresist available from Hoechst Celanese under the name AZ-P4620. After the mask 22 has been imaged and the via 24 developed in accordance with known practices, the solder 26 is plated onto the exposed portion of the seed layer 20, yielding the structure shown in FIG. 1 (which also shows a layer 30 discussed below). During the plating process, the seed layer 20 serves as a plating seed conductor to the solder alloy being deposited. Suitable plating processes and baths are known to those skilled in the art, and therefore will not be discussed in any detail here. The minimum thickness for the seed layer 20 is determined by its electrical resistance across the chip 10. The resistance must be sufficiently low so that the voltage drop due to the current going away from the current contact is low compared to the voltage drop between the wafer surface and the plating solution. As a result, the entire wafer surface is substantially at the same potential so that the plated thickness will be uniform. The maximum thickness for the seed layer 20 is determined by how much of the seed layer 20 can be dissolved into the solder 26 during reflow. The entire seed layer 20 must be dissolved into the solder 26 by the time the solder 26 has coalesced into a molten sphere (i.e., the bump 28 shown in FIG. 4). Based on the above, a preferred thickness for the seed layer 20 is believed to be in the range of about 0.15 to about 0.25 micrometer.

As can be seen from FIGS. 1 and 2, the via 24 can have a different size and shape than the UBM 18 because the solder 26 is plated onto the seed layer 20, which completely covers the UBM 18 and surrounding portions of the chip surface. In the prior art, the size of the UBM 18, resist thickness and bump spacing would have dictated the amount of solder 26 that can be deposited by plating. With this invention, the presence of the seed layer 20 enables the amount of solder 26 to be deposited, and therefore the size of the solder bump 28, to be free of the conventional limitations imposed by the UBM 18. Therefore, a notable advantage of the invention is that the area of the plated solder 26 can be significantly larger than the UBM 18, so that greater solder volumes and solder bump heights can be obtained for a given combination of photoresist thickness and allowed mushrooming by simply increasing the size of the via 24. Advantages of larger solder bumps achieved with this invention include improved reliability and increased stand-off between the chip 10 and the surface to which the chip 10 is eventually attached, which facilitates underfilling of the chip 10 with an adhesive.

A limitation to the size of the via 24 is the tendency for the seed layer 20 and solder 26 to leave residue on regions of the passivation layer 12 most remote from the solder bump 28 following solder reflow. For example, residues in the form of intermetallics, e.g., copper-tin and lead intermetallics, have been found on the chip surface between bumps if the via 24 is larger than the perimeter of the bump 28. The risk of such residues is apparent from FIG. 2, which is a plan view of the chip 10 shown in FIG. 1. The via 24 is shown as being considerably larger than the underlying pad 16 and UBM 18. While the via 24 is shown as having an oblong shape, other shapes could be used, e.g., circular, rectangular, hexagonal, etc., as long as the area of the via 24 is larger than the UBM 18. With the via size and shape shown in FIG. 2, the mask 22 can be much thinner than would be otherwise necessary to form a solder bump of comparable size using a conventionally round via. For example, to deposit (without mushrooming) the same volume of solder 26 that can be accommodated with the oblong via 24 in a mask 22 having a thickness of twenty micrometers, a round via would require a mask thickness of fifty micrometers. Those skilled in the art will appreciate that a process using a twenty-micrometer photoresist mask has significant cost advantages over a process using a fifty-micrometer photoresist mask. However, the seed layer 20 and solder 26 deposited at the longitudinal extremities of the via 24 are so remote from the UBM 18 that, during reflow of the solder 26, not all of the seed layer 20 and solder 26 is drawn onto the UBM 18 to form the solder bump 28. Instead, fragments of these materials are left on the surface of the chip 10, leading to the possibility of electrical shorting and other undesirable consequences to the chip 10.

To enable the size of the via 24 to be significantly larger than the UBM 18 without the risk of these undesirable residues, the present invention further includes a sacrificial layer 30 beneath the seed layer 20 and surrounding the UBM 18. The sacrificial layer 30 is deposited or patterned to define an edge 32 either on top of or, as shown, outside of the UBM 18, forming an annular-shaped gap in which a surface region 34 of the passivation layer 12 separates the UBM 18 and the sacrificial layer 30. As a result, the seed layer 20 is deposited on the UBM 18, a surface portion of the sacrificial layer 30 surrounding the UBM 18, and the surface region 34 of the passivation layer 12 therebetween, as seen in FIGS. 1 and 2. As a result, those portions of the seed layer 20 (and the solder 26) most remote from the UBM 18 do not directly contact the passivation layer 12, but instead are separated from the passivation layer 12 by the sacrificial layer 30. The advantage of this structure will become apparent from the following discussion pertaining to FIG. 3.

After depositing the solder 26, the mask 22 and that portion of the seed layer 20 not covered by the solder 26 are removed, yielding the structure shown in FIG. 3. The seed layer 20 can be removed without damaging the solder 26. For example, a copper seed layer 20 can be simultaneously oxidized and the oxide removed with a solution of about 1% hydrogen peroxide and about 1% sulfuric acid in water between room temperature and about 50 C. It is foreseeable that other etchants and processes could be used to remove the seed layer 20. FIG. 3 shows that the sacrificial layer 30 is also stripped, with the result that those portions of the seed layer 20 (and solder 26) most remote from the UBM 18 are separated from the passivation layer 12 by a gap 36. To facilitate its removal, suitable materials for the sacrificial layer 30 include conventional photoresist materials, such as positive photoresists commercially available under the names Shipley System 827 and 1822, which can be stripped using commercially-available chemicals such as ST-44 from Advanced Chemical Systems International (ACSI). Forming the sacrificial layer 30 of a photoresist material is compatible with chip processing, necessitating only an additional photoresist process and deposition of the seed layer 20 at a temperature below the melting point of the photoresist material. It is foreseeable that materials other than photoresists could be used to form the sacrificial layer 30.

As depicted in FIG. 1, the edge 32 of the sacrificial layer 30 is preferably tapered so that the thickness of the layer 30 gradually increases away from the UBM 18. The benefit of the tapered edge 32 is to improve the thickness uniformity of the seed layer 20 deposited where the sacrificial layer 30 and the passivation layer 12 meet, which improves the conductivity of the plating current to the UBM 18 during plating of the solder 26. If the sacrificial layer 30 is formed of a photoresist material, the tapered edge 32 can be produced by sufficiently heating the layer 30 to flow the edge 32. As a result of heating, the contour of the edge 32 will typically be rounded as a result of coalescence of the softened or molten photoresist material.

According to known practices, the solder 26 of the structure shown in FIG. 3 is then reflowed, during which the solder 26 melts and coalesces to form the spherical-shaped solder bump 28 shown in FIG. 4, which is attached to the chip 10 only at the UBM 18. Because the mask 22 is not present during reflow, solder compositions that can be used to form the solder bump 28 are not limited to those with reflow temperatures at or below the maximum temperature that the mask 22 can withstand and still be removed after reflow. Accordingly, a wide variety of tin-lead solder alloys can be used with this invention, as well as other tin or indium-based solder systems capable of dissolving the seed layer 20.

As evident from FIG. 4, the seed layer 20 preferably dissolves into the solder alloy during reflow, necessitating that the seed layer 20 is formed of a material that is soluble in the solder alloy. Because of its minimal thickness, the seed layer 20 becomes a low level component of the solder alloy. Copper and silver are particularly suitable for the seed layer 20 because each is soluble in tin-lead solder alloys and can serve to enhance certain properties of the solder connection eventually formed by the solder bump 28. For example, copper and silver contents of up to about 1% and about 2%, respectively, in a tin-lead solder alloy can enhance adhesion, resistance to electromigration, and mechanical properties such as tensile strength and creep resistance.

While the invention has been described in terms of a preferred embodiment, it is apparent that other forms could be adopted by one skilled in the art. Accordingly, the scope of the invention is to be limited only by the following claims.

What is claimed is:

1. A solder bumping method comprising the steps of:

forming an input/output pad on a substrate;

forming a metal layer on the input/output pad;

forming a sacrificial layer on the substrate and surrounding the metal layer;

forming a plating seed layer on the metal layer and the sacrificial layer;

forming a mask on the plating seed layer, the mask having a via therein that exposes a portion of the plating seed layer overlying the metal layer and the sacrificial layer; and then depositing a solder material on the portion of the plating seed layer within the via.

2. A solder bumping method according to claim 1, wherein the plating seed layer is a metal chosen from the group consisting of copper and silver, and has a thickness of about 0.15 to about 0.25 micrometer.

3. A solder bumping method according to claim 1, wherein the portion of the plating seed layer exposed by the via in the mask includes a surface region between the metal layer and the sacrificial layer.

4. A solder bumping method according to claim 1, wherein the sacrificial layer is formed of a photoresist material.

5. A solder bumping method according to claim 1, wherein the sacrificial layer is formed to have an edge that circumscribes the metal layer and is spaced apart from the metal layer.

6. A solder bumping method according to claim 1, wherein the sacrificial layer is heated to flow the edge thereof so that the sacrificial layer at the edge is relatively thicker in a direction away from the metal layer.

7. A solder bumping method according to claim 1, further comprising the step of forming a passivation layer prior to the steps of forming the plating seed layer and the sacrificial layer, the passivation layer being formed to have an opening therein that exposes a portion of the input/output pad, wherein the metal layer overlays and contacts the portion of the input/output pad through the opening in the passivation layer.

8. A solder bumping method according to claim 1, wherein the via in the mask is formed to have a shape such that the solder material in the via has a larger surface area than the metal layer.

9. A solder bumping method according to claim 1, wherein the substrate is a surface-mount circuit device.

10. A solder bumping method according to claim 1, further comprising the steps of:

removing the mask;

removing a first portion of the plating seed layer not covered by the solder material so as to leave a second portion of the plating seed layer beneath the solder material;

removing the sacrificial layer including a portion of the sacrificial layer underlying the second portion of the plating seed layer so as to form a gap between the substrate and the second portion of the plating seed layer; and then reflowing the solder material so as to form a solder bump into which the second portion of the plating seed layer is dissolved.

11. A method of forming a solder bump on a surface-mount circuit device having an input/output pad on a surface thereof, a passivation layer on the surface and having an opening through a portion of the input/output pad is exposed, and a solderable metal layer on the portion of the input/output pad within the opening in the passivation layer, the method comprising the steps of:

depositing a sacrificial photoresist layer on the passivation layer and surrounding the solderable metal layer, the sacrificial photoresist layer being formed to have an edge that circumscribes the solderable metal layer and is spaced apart from the solderable metal layer so that a surface region of the passivation layer lies between the solderable metal layer and the sacrificial photoresist layer;

heating the sacrificial photoresist layer to flow the edge thereof so that the sacrificial photoresist layer at the edge is relatively thicker in a direction away from the solderable metal layer;

plating a seed layer on the solderable metal layer, the surface region of the passivation layer, and the sacrificial photoresist layer;

depositing a mask on the seed layer;

forming a via in the mask to expose a portion of the seed layer overlying the solderable metal layer, the surface region of the passivation layer and the sacrificial photoresist layer, the via being formed to have an oblong shape so as to have a first width dimension that is wider than the solderable metal layer and a second width dimension that is wider than the first width dimension thereof;

plating a solder material to completely fill the via, the seed layer serving as a plating seed conductor to the solder material;

removing the mask;

removing a first portion of the plating seed layer not covered by the solder material so as to leave a second portion of the plating seed layer beneath the solder material;

removing the sacrificial photoresist layer including a portion of the sacrificial photoresist layer underlying the second portion of the plating seed layer so as to form a gap between the passivation layer and the second portion of the plating seed layer; and then reflowing the solder material so as to form a solder bump into which the second portion of the plating seed layer is dissolved.

* * * * *